United States Patent
Funk et al.

(10) Patent No.: US 10,627,118 B2
(45) Date of Patent: *Apr. 21, 2020

(54) COOKING ENGAGEMENT SYSTEM EQUIPPED WITH HUMIDITY SENSOR

(71) Applicant: Haier US Appliance Solutions, Inc., Wilmington, DE (US)

(72) Inventors: Michael Andrew Funk, Louisville, KY (US); James Lee Armstrong, Louisville, KY (US); Stephen Bernard Froelicher, Shepherdsville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 124 days.

This patent is subject to a terminal disclaimer.

(21) Appl. No.: 16/053,854

(22) Filed: Aug. 3, 2018

(65) Prior Publication Data

US 2020/0041142 A1   Feb. 6, 2020

(51) Int. Cl.
| | | |
|---|---|---|
| *F24C 15/20* | (2006.01) | |
| *G01N 27/22* | (2006.01) | |
| *H05K 7/20* | (2006.01) | |
| *H05K 5/02* | (2006.01) | |

(52) U.S. Cl.
CPC ...... *F24C 15/2042* (2013.01); *F24C 15/2021* (2013.01); *F24C 15/2071* (2013.01); *G01N 27/223* (2013.01); *H05K 5/0239* (2013.01); *H05K 7/20972* (2013.01)

(58) Field of Classification Search
CPC ........ F24C 15/20; H05K 7/20972; H05K 5/02
See application file for complete search history.

(56) References Cited

U.S. PATENT DOCUMENTS

| | | | |
|---|---|---|---|
| 5,981,929 A | 11/1999 | Maeda et al. | |
| 6,132,084 A | 10/2000 | Whipple, III et al. | |
| 6,204,623 B1 | 3/2001 | Levy et al. | |
| 6,621,058 B1 * | 9/2003 | Kim | F24C 15/2028 126/21 A |
| 7,699,051 B2 * | 4/2010 | Gagas | F24C 15/2028 126/299 D |
| 7,866,312 B2 * | 1/2011 | Erdmann | F24C 3/12 126/299 D |
| 8,074,637 B2 * | 12/2011 | Yamauchi | F24C 15/2021 126/299 D |

(Continued)

FOREIGN PATENT DOCUMENTS

CN   2513031 Y   9/2002

*Primary Examiner* — Edelmira Bosques
*Assistant Examiner* — Nikhil P Mashruwala
(74) *Attorney, Agent, or Firm* — Dority & Manning, P.A.

(57) ABSTRACT

A cooking engagement system and methods therefore are provided. The system includes a cooktop appliance and an interactive assembly positioned above the cooktop appliance. The interactive assembly includes an image monitor that presents various images and information to a user, e.g., recipes. The system includes a humidity sensor for detecting operation of the cooktop appliance. When the humidity sensor senses a humidity level that exceeds a threshold, a controller communicatively coupled thereto activates an air handler to move or motivate an airflow across or about the image monitor. In this way, the image monitor may be cooled and condensation is prevented from forming on the imaging surface of the image monitor.

10 Claims, 8 Drawing Sheets

(56) References Cited

U.S. PATENT DOCUMENTS

| | | | |
|---|---|---|---|
| 9,494,324 B2* | 11/2016 | Livchak | F24C 15/2021 |
| 9,581,338 B2 | 2/2017 | Yamanaka et al. | |
| 2005/0092745 A1* | 5/2005 | Yim | F24C 15/2028 |
| | | | 219/757 |
| 2005/0224069 A1* | 10/2005 | Patil | F24C 15/2021 |
| | | | 126/299 D |
| 2007/0062513 A1* | 3/2007 | Gagas | F24C 15/2021 |
| | | | 126/299 D |
| 2008/0102743 A1 | 5/2008 | Williams | |
| 2010/0041141 A1* | 2/2010 | Trono | C07K 14/55 |
| | | | 435/369 |
| 2019/0154267 A1* | 5/2019 | Garces | F24C 3/124 |
| 2019/0368746 A1* | 12/2019 | Armstrong | F24C 15/2042 |
| 2019/0380230 A1* | 12/2019 | Armstrong | H05K 7/20972 |
| 2020/0041143 A1* | 2/2020 | Froelicher | F24C 15/2042 |

\* cited by examiner

COOKING ENGAGEMENT SYSTEM EQUIPPED WITH HUMIDITY SENSOR

FIELD OF THE INVENTION

The present subject matter relates generally to systems for aiding cooking operations, and more particularly to systems for enhancing cooking engagement and convenience with a cooktop appliance.

BACKGROUND OF THE INVENTION

Cooktop or range appliances generally include heating elements for heating cooking utensils, such as pots, pans, and griddles. A variety of configurations can be used for the heating elements located on the cooking surface of the cooktop. The number of heating elements or positions available for heating on the range appliance can include, for example, four, six, or more depending upon the intended application and preferences of the buyer. These heating elements can vary in size, location, and capability across the appliance.

Unfortunately, existing systems can provide an unsatisfactory user experience and can inhibit a user's desired interactions. Recipe books are often cumbersome and difficult to use while cooking. Pages may rip, stain, burn, or become otherwise damaged during use. Moreover, printed materials do not allow for immediate real-time guidance or information. Electronic devices that are connected to the Internet, such as a computer, tablet, or smartphone, may allow for immediate interaction with remote information servers or individuals. However, such devices are generally not suitable for use in tandem with a cooktop appliance. A user may be forced to repeatedly move away from the cooktop appliance in order to view the device or provide any input instructions. Moreover, the extreme environment near a cooktop appliance may risk damaging the device. For instance, a display of the device may be rendered unusable. In particular, food or steam may obscure the display. In some cases, heat or exhaust fumes may flow across the display screen, causing condensation to form thereon and increasing the potential for display failure.

As a result, improved systems are needed for facilitating user engagement and interaction during use of a cooktop appliance. In particular, it may be advantageous to provide a user engagement system to permit the viewing or accessing images and information while using a cooktop appliance. In some cases, it may be advantageous to further provide a user engagement system configured to protect one or more electronic components from the extreme environment near or above a cooktop appliance.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a system is provided. The system defines a vertical direction, a lateral direction, and a transverse direction. The system includes an interactive assembly. The interactive assembly includes a casing. The interactive assembly also includes an image monitor supported by the casing. Further, the interactive assembly includes an air handler mounted within the casing. Moreover, the interactive assembly includes a humidity sensor mounted to or within the casing. In addition, the interactive assembly include a controller communicatively coupled with the air handler and the humidity sensor. The controller is configured to receive, from the humidity sensor, one or more signals indicative of a humidity level of air proximate the humidity sensor; determine whether the humidity level has exceeded a predetermined activation threshold based at least in part on the one or more signals received from the humidity sensor; and activate the air handler based at least in part on whether the humidity level has exceeded the predetermined activation threshold so that air is moved across or about the image monitor.

In another exemplary aspect of the present disclosure, a method for operating a system comprising an interactive assembly is provided. The method includes receiving one or more signals from a humidity sensor indicative of a humidity level of air proximate the humidity sensor, the humidity sensor disposed proximate an image monitor of the interactive assembly. Moreover, the method includes determining whether the humidity level of air proximate the humidity sensor has exceeded a predetermined activation threshold based at least in part on the one or more signals from the humidity sensor. In addition, the method includes activating an air handler disposed within a casing of the interactive assembly based at least in part on whether the humidity level has exceeded the predetermined activation threshold so that air is moved across or about the image monitor.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
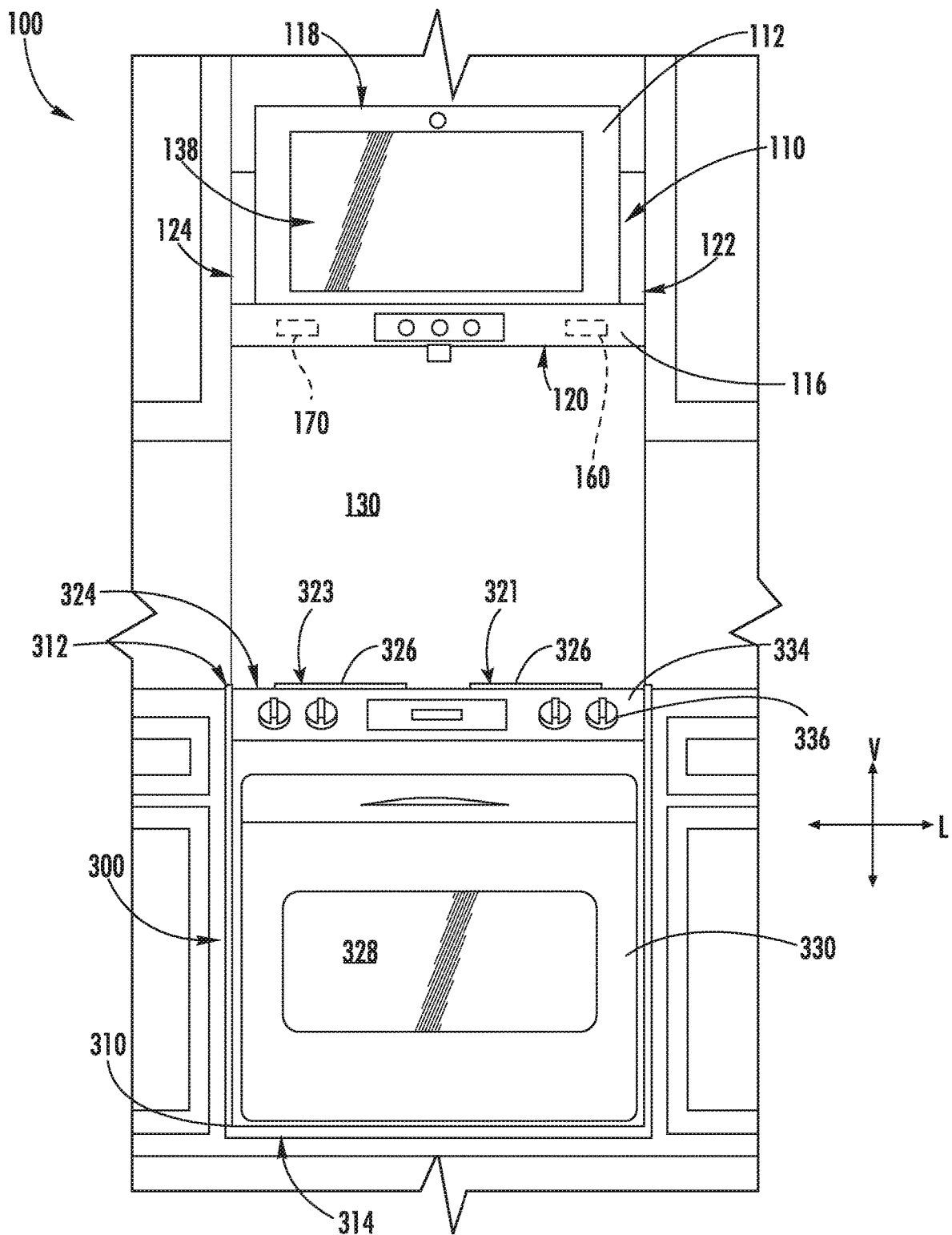
FIG. 1 provides a front perspective view of a system according to exemplary embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In order to aid understanding of this disclosure, several terms are defined below. The defined terms are understood to have meanings commonly recognized by persons of ordinary skill in the arts relevant to the present disclosure. The terms "includes" and "including" are intended to be inclusive in a manner similar to the term "comprising." Similarly, the term "or" is generally intended to be inclusive (i.e., "A or B" is intended to mean "A or B or both"). The terms "first," "second," and "third" may be used interchangeably to distinguish one component from another and are not intended to signify location or importance of the individual components.

Figure 2:
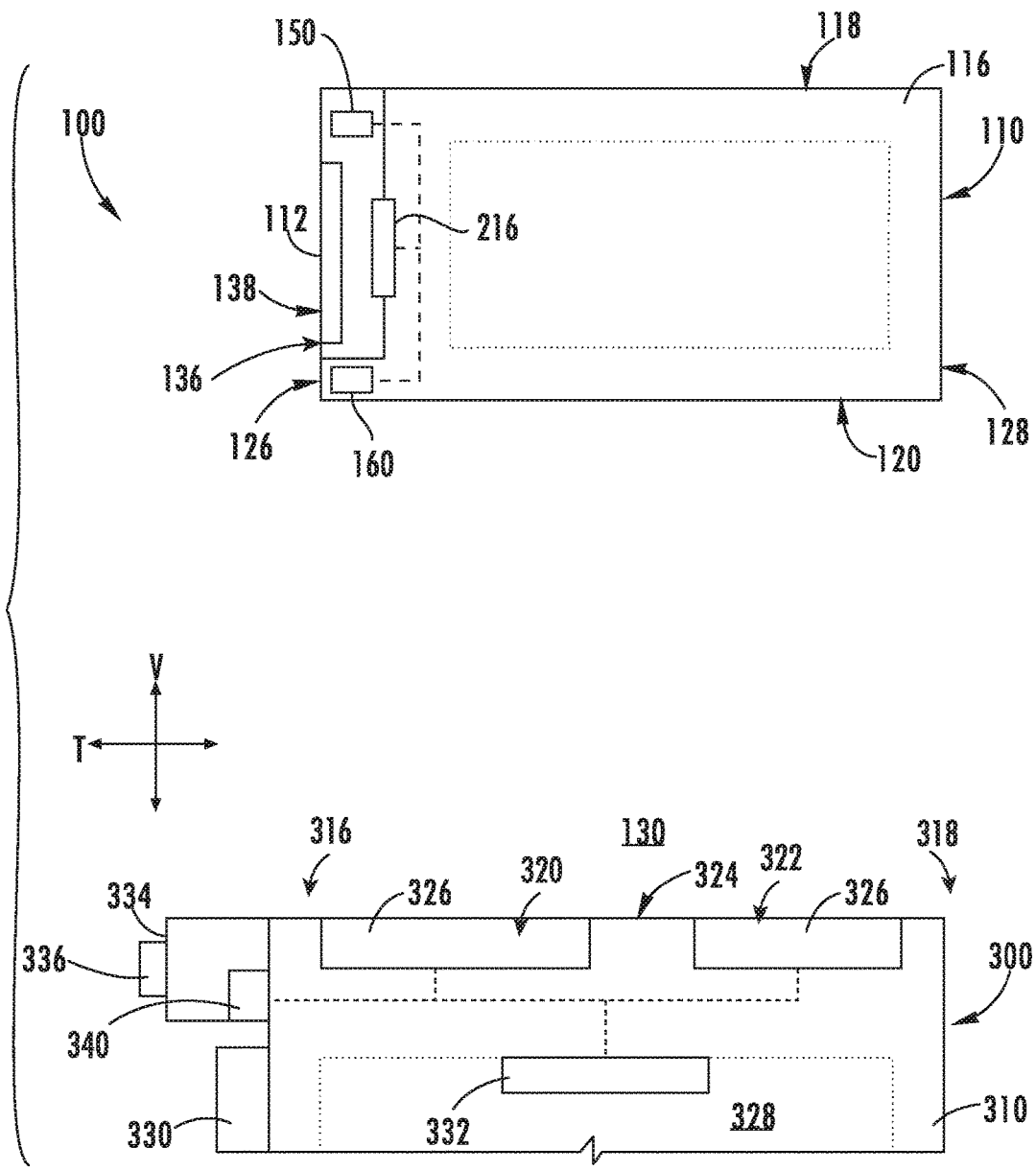
FIG. 2 provides a side schematic view of the exemplary system of FIG. 1.

FIGS. 1 and 2 provide various views of a system 100 according to exemplary embodiments of the present disclosure. Generally, system 100 includes a cooktop appliance 300 and an interactive assembly 110 positioned above cooktop appliance 300 as shown in FIGS. 1 and 2. The features of cooktop appliance 300 and interactive assembly 110 are provided below.

As shown in FIGS. 1 and 2, cooktop appliance 300 defines a vertical direction V, a lateral direction L (FIG. 1), and a transverse direction T (FIG. 2). The vertical, lateral, and transverse directions V, L, T are mutually perpendicular and form an orthogonal direction system. For this embodiment, cooktop appliance 300 extends between a top portion 312 and a bottom portion 314 (FIG. 1), e.g., along the vertical direction V; between a left side portion and a right side portion, e.g., along the lateral direction L; and between a front portion 316 and a rear portion 318 (FIG. 2), e.g., along the traverse direction T.

Cooktop appliance 300 includes a chassis or cabinet 310 and a cooktop surface 324 having one or more heating elements 326 for use in, for example, heating or cooking operations. In some embodiments, cooktop surface 324 is constructed with ceramic glass. In other embodiments, however, cooktop surface 324 may be formed of another suitable material, such as a metallic material (e.g., steel) or another suitable non-metallic material. Heating elements 326 may be various sizes and may employ any suitable method for heating or cooking an object, such as a cooking utensil (not shown), and its contents. In some embodiments, for example, heating element 326 uses a heat transfer method, such as electric coils or gas burners, to heat the cooking utensil. In other embodiments, however, heating element 326 uses an induction heating method to heat the cooking utensil directly. Accordingly, heating element 326 may include a gas burner element, resistive heat element, radiant heat element, induction element, or another suitable heating element. As shown particularly in FIG. 2, for this embodiment, the cooktop appliance 300 includes at least one forward heating element 320 and at least one rear heating element 322.

In addition, as further shown in FIGS. 1 and 2, cabinet 310 is insulated and defines a cooking chamber 328 selectively covered by a door 330. One or more chamber heating elements 332 (e.g., top broiling elements or bottom baking elements) may be enclosed within cabinet 310 to heat cooking chamber 328. Chamber heating elements 332 within cooking chamber 328 may be provided as any suitable element for cooking the contents of cooking chamber 328, such as an electric resistive heating element, a gas burner, a microwave element, a halogen element, etc. Thus, cooktop appliance 300 may be referred to as an oven range appliance. As will be understood by those skilled in the art, cooktop appliance 300 is provided by way of example only, and the present subject matter may be used in the context of any suitable cooktop appliance, such as a standalone cooktop fitted integrally with a surface of a kitchen counter. Thus, the example embodiments illustrated in the figures are not intended to limit the present subject matter to any particular cooking chamber or heating element configuration, except as otherwise indicated.

As illustrated, cooktop appliance 300 includes a user interface panel 334, e.g., positioned at the forward portion 316 of the cooktop appliance 300. Although shown at front portion 316 of cooktop appliance 300, another suitable locations or structures (e.g., a backsplash) for supporting user interface panel 334 may be provided in alternative embodiments. For this embodiment, user interface panel 334 includes input components or controls 336, such as one or more of a variety of electrical, mechanical, or electro-mechanical input devices. Controls 336 may include, for example, rotary dials, knobs, push buttons, and touch pads. A controller 340 (FIG. 2) is communicatively coupled with user interface panel 334 and controls 336, e.g., by a suitable wired or wireless connection, for controlling cooktop appliance. Thus, a user may select various operational features and modes via controls 336 and monitor progress of cooktop appliance 300. In additional or alternative embodiments, user interface panel 334 includes a display component, such as a digital or analog display, communicatively coupled with controller 340. The display component is configured to provide operational feedback to a user. In certain embodiments, user interface panel 334 represents a general purpose I/O ("GPIO") device or functional block.

As noted above, controller 340 is communicatively coupled (i.e., in operative communication) with user interface panel 334 and controls 336. Controller 340 may also be communicatively coupled with various operational components of cooktop appliance 300 as well, such as heating elements (e.g., 326, 332), sensors, etc. Input/output ("I/O") signals may be routed between controller 340 and the various operational components of cooktop appliance 300. Thus, controller 340 can selectively activate and operate these various components. Various components of cooktop appliance 300 are communicatively coupled with controller 340 via one or more communication lines such as, for example, conductive signal lines, shared communication busses, or wireless communications bands.

In some embodiments, controller 340 includes one or more memory devices and one or more processors. The processors can be any combination of general or special purpose processors, CPUs, or the like that can execute programming instructions or control code associated with operation of cooktop appliance 300. The memory devices (i.e., memory) may represent random access memory such as DRAM or read only memory such as ROM or FLASH. In one embodiment, the processor executes programming instructions stored in memory. The memory may be a separate component from the processor or may be included onboard within the processor. Alternatively, controller 340 may be constructed without using a processor, for example, using a combination of discrete analog or digital logic circuitry (such as switches, amplifiers, integrators, comparators, flip-flops, AND gates, and the like) to perform control functionality instead of relying upon software.

In certain embodiments, controller 340 includes a network interface such that controller 340 can connect to and communicate over one or more networks with one or more network nodes. Controller 340 can also include one or more transmitting, receiving, or transceiving components for transmitting/receiving communications with other devices communicatively coupled with cooktop appliance 300. Additionally or alternatively, one or more transmitting, receiving, or transceiving components can be located off board controller 340. Generally, controller 340 can be positioned in any suitable location throughout cooktop appliance 300. For example, controller 340 may be located proximate user interface panel 334 toward front portion 316 of cooktop appliance 300.

As shown further in FIGS. 1 and 2, interactive assembly 110 includes one or more casings positioned above cooktop appliance 300 along the vertical direction V. For this embodiment, interactive assembly 110 includes a casing 116 positioned above cooktop appliance 300. Casing 116 includes a plurality of outer walls and generally extends between a top end 118 and a bottom end 120, e.g., along the vertical direction V; between a first side end 122 and a second side end 124 (FIG. 1), e.g., along the lateral direction L; and between a front end 126 and a rear end 128 (FIG. 2), e.g., along the transverse direction T. In some embodiments, casing 116 is spaced from cooktop surface 324 along the vertical direction V. An open region 130 may thus be defined along the vertical direction V between cooktop surface 324 and bottom end 120 of casing 116.

In some embodiments, casing 116 is formed as a range hood. As will be described in detail below, a ventilation assembly 140 (shown in FIGS. 6 and 7) within casing 116 may move an airflow from the open region 130 through casing 116. However, a range hood is provided by way of example only. Other configurations may be used within the spirit and scope of the present disclosure. For example, casing 116 could be part of a microwave or other appliance designed to be located above cooktop surface 324. Moreover, although a generally rectangular shape is illustrated, any suitable shape or style may be adapted to form the structure of casing 116.

As further depicted in FIGS. 1 and 2, the interactive assembly 110 includes a controller 150 (FIG. 2) and an image monitor 112 communicatively coupled thereto. The image monitor 112 is mounted to and supported by casing 116. Image monitor 112 is provided above cooktop surface 324, e.g., along the vertical direction V. More particularly, for this embodiment, image monitor 112 is mounted to and supported on casing 116 (e.g., directly above cooktop surface 324) proximate to the front end 126 of casing 116. Generally, image monitor 112 may be any suitable type of mechanism for visually presenting an image (e.g., a digital image). For example, image monitor 112 may be a liquid crystal display (LCD), a plasma display panel (PDP), a cathode ray tube (CRT) display, etc. Image monitor 112 includes an imaging surface 138 (e.g., screen or display panel) at which the image is presented or displayed as an optically-viewable picture (e.g., static image or dynamic video) to a user. Optionally, a protective transparent panel (e.g., formed from a transparent glass, plastic, etc.) may be positioned across or over imaging surface 138. In such embodiments, the protective transparent panel is mounted within or supported on casing 116 forward of imaging surface 138 along the transverse direction T. In some exemplary embodiments, the image monitor 112 has touchscreen capability. In this way, a user may touch various digitally presented images to control various features, such as e.g., the images displayed by image monitor 112, appliances communicatively coupled with controller 150, and other features, such as e.g., a camera, a microphone, etc.

The optically-viewable image at the imaging surface 138 of image monitor 112 may correspond to any suitable signal or data received or stored by interactive assembly 110 (e.g., at controller 150). As an example, image monitor 112 may present recipe information in the form of viewable text or images. As another example, image monitor 112 may present a remotely captured image, such as a live (e.g., real-time) dynamic video stream received from a separate user or device. As yet another example, image monitor 112 may present a graphical user interface (GUI) that allows a user to select or manipulate various operational features of interactive assembly 110, cooktop appliance 300, or other components communicatively coupled with controller 150, e.g., via image monitor's touchscreen capabilities described above. During use of such GUI embodiments, a user may engage, select, or adjust the image presented at image monitor 112 through any suitable input, such as gesture controls detected through a camera assembly, voice controls detected through one or more microphones, associated touch panels (e.g., capacitance or resistance touch panel) or sensors overlaid across imaging surface 138, etc.

As illustrated best in FIG. 2, for this embodiment, the imaging surface 138 is oriented orthogonal to cooktop surface 324 and generally faces, or is directed away from, cooktop surface 324. In particular, imaging surface 138 is directed toward an area forward of cooktop appliance 300. During use, a user standing in front of cooktop appliance 300 may view the optically-viewable images (e.g., recipe, dynamic video stream, graphical user interface, etc.) displayed at imaging surface 138. Optionally, the imaging surface 138 may be positioned at an angle with respect to the vertical direction V.

Figure 3:
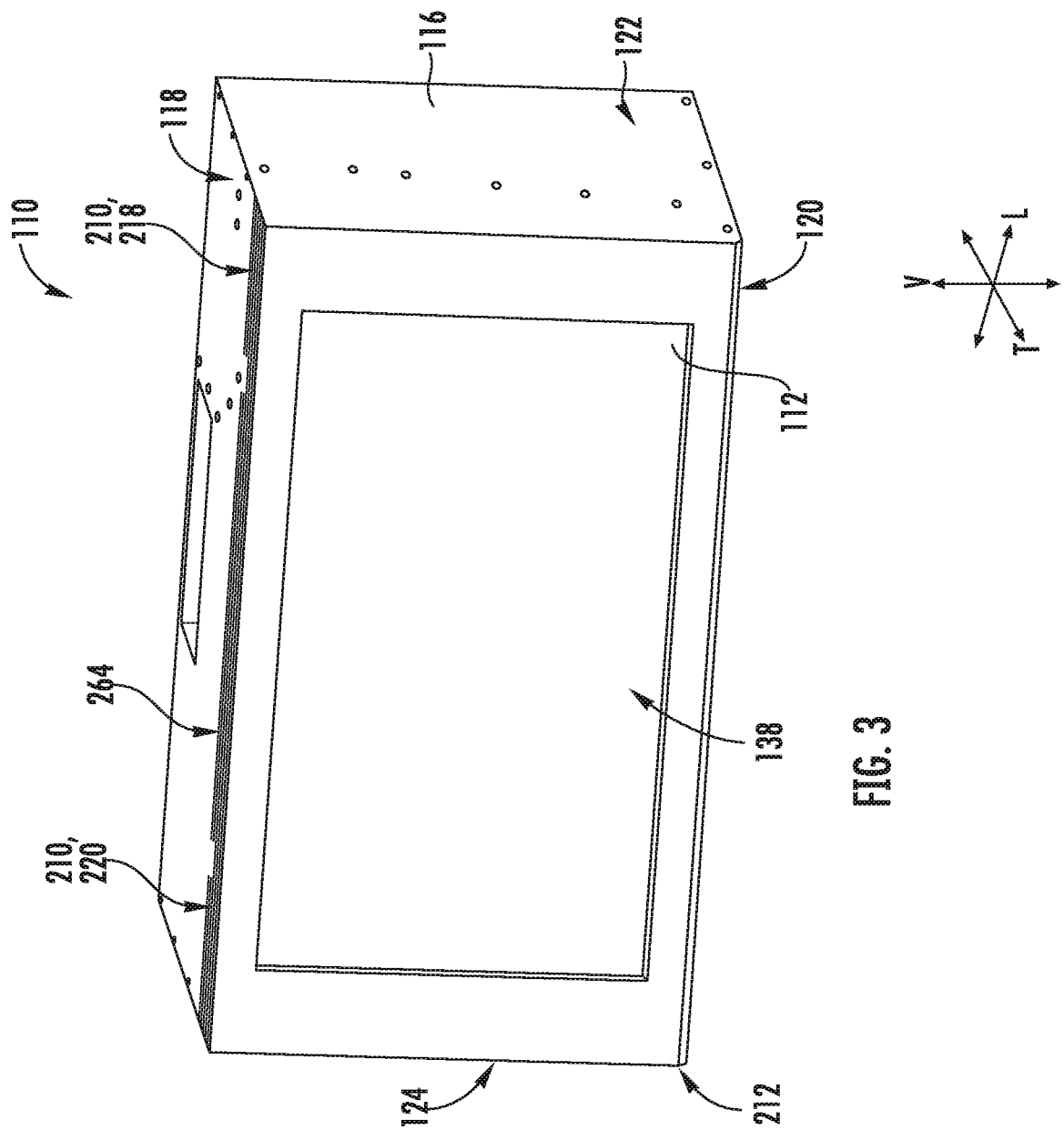
FIG. 3 provides a perspective view of an interactive assembly of a system according to exemplary embodiments of the present disclosure.
Figure 4:
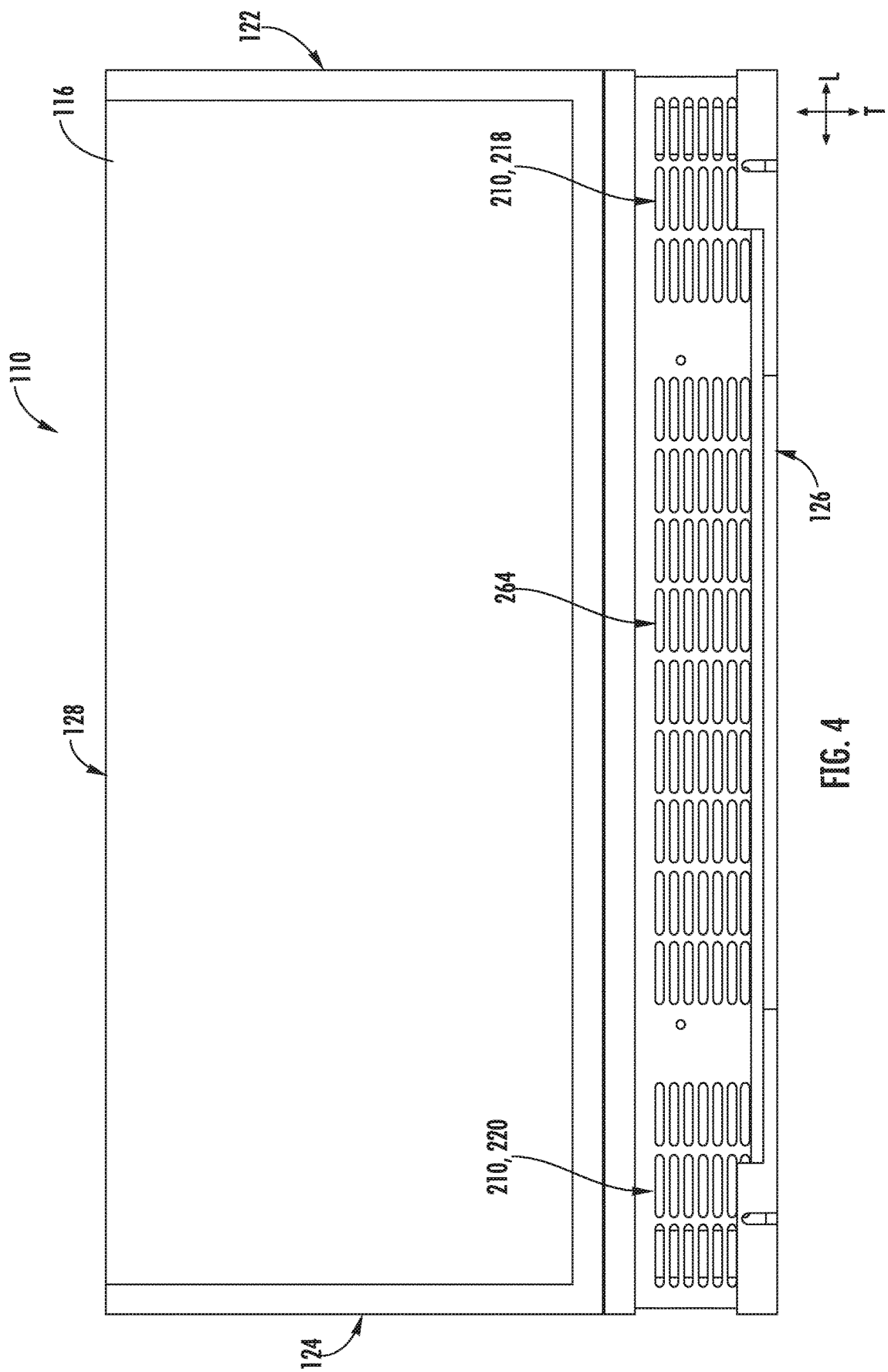
FIG. 4 provides a top perspective view of the exemplary interactive assembly of FIG. 3.
Figure 5:
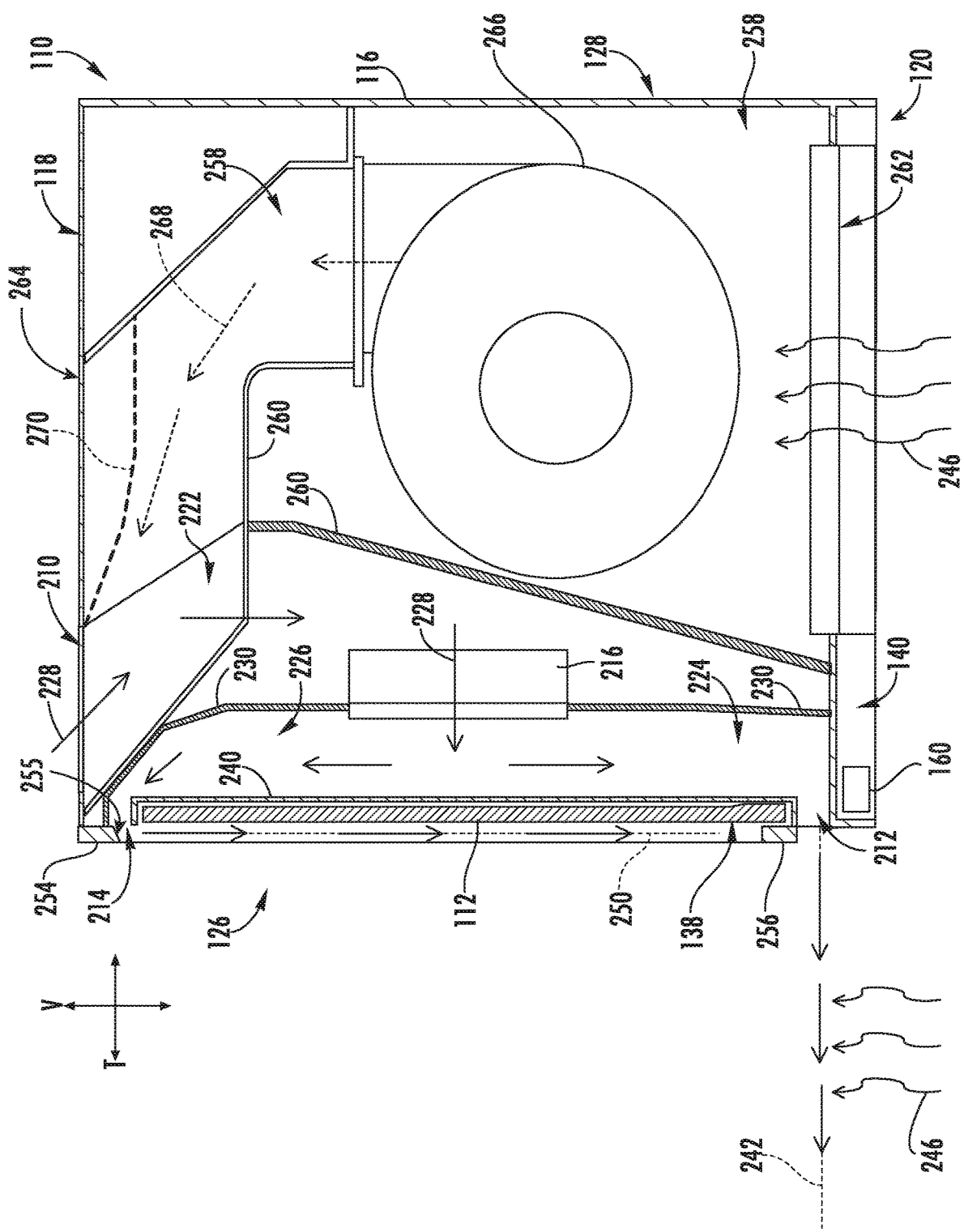
FIG. 5 provides a cross-sectional schematic view of an interactive assembly of a system according to exemplary embodiments of the present disclosure.

FIGS. 3, 4, and 5 provide various views of interactive assembly 110 according to exemplary embodiments of the present disclosure. As noted previously, casing 116 extends between top end 118 and bottom end 120 (FIGS. 3 and 5), e.g., along the vertical direction V, between front end 126 and rear end 128 (FIGS. 4 and 5), e.g., along the transverse direction T, and between first side end 122 and second side end 124 (FIGS. 3 and 4), e.g., along the lateral direction L. One or more air inlets 210 and air outlets 212, 214 are defined by casing 116 (e.g., through one or more external walls of casing 116). Moreover, as shown best in FIG. 5, one or more air handlers 216 (e.g., fans or blowers) are mounted within casing 116 to move or motivate an airflow through one or more passages or cavities defined within casing 116 between the air inlet 210 and the air outlets 212, 214. For this embodiment, air handler 216 is mounted within casing 116 downstream of at least one air inlet 210 and upstream of at least one air outlet 212, 214.

In some embodiments, air inlet 210 is defined at a position proximate to the top end 118 (e.g., above image monitor 112 relative to the vertical direction V), while one or more of air outlets 212, 214 are defined at a position (e.g., discrete positions) proximate to the front end 126. Additionally or alternatively, the air inlet 210 may be defined through the casing 116 behind the image monitor 112 relative to the transverse direction T. As shown, for instance in FIG. 4, air inlet 210 may include a plurality of inlet apertures defined through a top wall of casing 116. In some embodiments, the inlet apertures include a first aperture set 218 that is spaced apart from a second aperture set 220, e.g., along the lateral direction L. First aperture set 218 may be proximate to first side end 122 and second aperture set 220 may be proximate to second side end 124. Thus, air may be drawn into casing 116 from both first side end 122 and second side end 124.

One or more air passages are defined by casing 116 and provide fluid communication between air inlet 210 and air outlets 212, 214. For the depicted embodiment of FIG. 5, an air intake passage 222 is defined within casing 116. Particularly, air intake passage 222 is defined at a location proximate the front end 126. In some embodiments, air intake passage 222 may provide a common cavity open to both first aperture set 218 and second aperture set 220. Further, for this embodiment, air intake passage 222 extends generally along the vertical direction V and rearward along the transverse direction T (e.g., behind or rearward of image monitor 112). One or more outlet passages 224, 226 are defined downstream of air intake passage 222. For instance, a lower outlet passage 224 extends downward along the vertical direction V to first air outlet 212 (e.g., defined proximate bottom end 120), while an upper outlet passage 226 extends upward along the vertical direction V to second air outlet 214 (e.g., defined proximate top end 118).

As shown best in FIG. 5, in some exemplary embodiments, air handler 216 is a common or shared air handler. For this embodiment, air handler 216 is fluidly connected with and positioned between air intake passage 222 and air outlet passages 224, 226. Common air handler 216 may be provided as any suitable blower or fan (e.g., radial fan, tangential fan, etc.) positioned within casing 116 to actively move or motivate air therethrough. Common air handler 216 is positioned upstream of both the first air outlet 212 and the second air outlet 214 and downstream of air inlet 210. As an example, common air handler 216 may be mounted to or on an internal duct wall 230 separating air intake passage 222 from air outlet passages 224, 226. Common air handler 216 may thus motivate an airflow (e.g., as indicated arrows 228) from air inlet 210 to first air outlet 212 and second air outlet 214 simultaneously.

Figure 6:
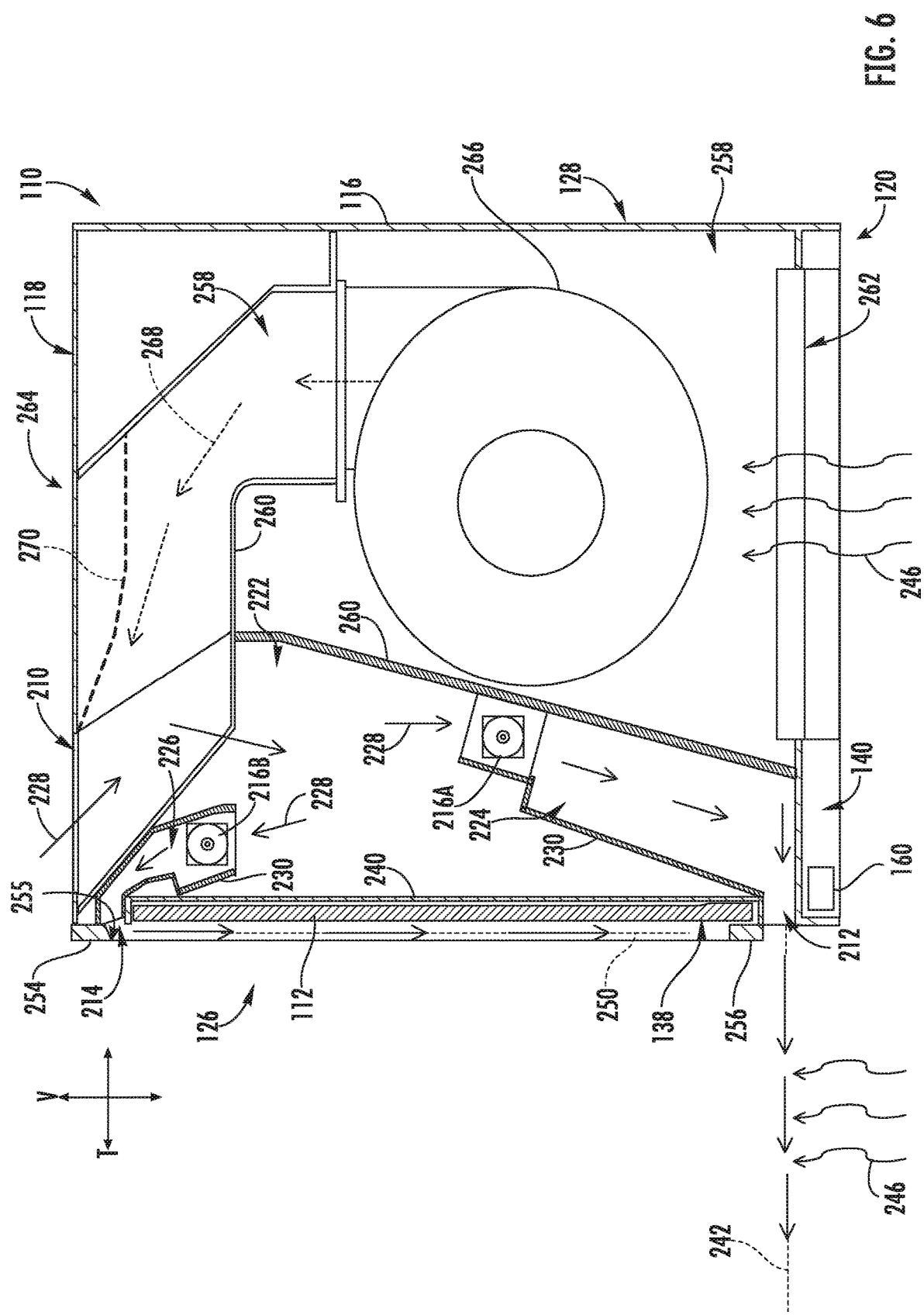
FIG. 6 provides a cross-sectional schematic view of an exemplary interactive assembly of a system according to another exemplary embodiment of the present disclosure.

FIG. 6 provides a cross-sectional schematic view of another exemplary interactive assembly 110 for system 100 in accordance with exemplary embodiments of the present disclosure. As shown in FIG. 6, in some embodiments, interactive assembly 110 includes multiple discrete air handlers 216A, 216B that correspond to different air outlets 212, 214. For instance, a first air handler 216A may be provided upstream of first air outlet 212, while second air handler 216B is provided upstream of second air outlet 214. As shown, in such embodiments, upper outlet passage 226 and lower outlet passage 224 are defined, at least in part, by separate duct walls 230. For this embodiment, upper outlet passage 226 and lower outlet passage 224 are spaced apart along the vertical direction V. First air handler 216A is mounted on or within lower outlet passage 224, while second air handler 216B is mounted on or within upper outlet passage 226. As will be appreciated, first and second air handlers 216A, 216B may each be provided as any suitable blower or fan (e.g., radial fan, tangential fan, etc.) positioned within casing 116 to actively move or motivate air therethrough.

As shown in FIGS. 5 and 6, in some embodiments, an internal wall 240 is positioned between image monitor 112 and one or both of the intake passage 222 or the air outlet passages 224, 226 along the transverse direction T (e.g., such that internal wall 240 separates image monitor 112 and intake passage 222 or outlet passages 224, 226). Advantageously, the airflow across internal wall 240 may convectively cool the electronic components within casing 116 (e.g., image monitor 112). Moreover, cooling may occur without passing the airflow directly across such electronic components.

In certain embodiments, one air outlet (e.g., curtain air outlet or first air outlet 212) is provided below image monitor 112. In particular, first air outlet 212 is defined by casing 116 at the front end 126 and directly below image monitor 112, e.g., along the vertical direction V. Thus, at least a portion of the airflow motivated by air handler 216 (FIG. 5) or air handler 216A (FIG. 6) may be directed from air inlet 210 to the ambient environment in front of casing 116 and image monitor 112 through first air outlet 212.

In some embodiments, as shown in both FIGS. 5 and 6, an airflow curtain path 242 is generally defined substantially orthogonal to the vertical direction V by first air outlet 212. In particular, airflow curtain path 242 may extend outward (e.g., in the transverse direction T) from casing 116 in front of image monitor 112. Airflow curtain path 242 may also extend along the lateral direction L as well. Thus, air moved through first air outlet 212 is projected from casing 116 along airflow curtain path 242, forming a curtain or blade of fast-moving air in front of casing 116 (i.e., forward of casing 116 along a direction orthogonal to the vertical direction V). In certain embodiments, airflow curtain path 242 is defined to have an airflow angle between 0° and 90° with respect to (i.e., relative to) one or both of the vertical direction V or the image surface 138 (e.g., in a direction generally parallel to or away from cooktop appliance 300 (FIG. 1)). Thus, airflow curtain path 242 (and its associated curtain of air) extends from casing 116 or imagine monitor 112 along the airflow angle.

During use of cooktop appliance 300, heat, steam, and/or exhaust fumes (e.g., as represented by arrows 246 in FIGS. 5 and 6) generated at cooktop appliance 300 (or another location directly beneath first air outlet 212) may be advantageously blocked or restricted by the mass of air flowing along airflow curtain path 242. In turn, the visibility at imaging surface 138 may be preserved, while further protecting various electronic components (e.g., imagine monitor 112 or controller 150 (FIG. 2)) mounted within casing 116 from damage that may be caused by heat, steam, or exhaust fumes 246. Optionally, image monitor 112 may be positioned such that imaging surface 138 extends away from airflow curtain path 242 (e.g., along a non-orthogonal angle relative to the vertical direction V).

With reference still to FIGS. 5 and 6, in certain embodiments, another air outlet (e.g., an upper or second air outlet 214) is defined by casing 116. For instance, second air outlet 214 may be defined through casing 116 at the top end 118. In particular, second air outlet 214 may be directed downward at the front end 126 of casing 116 forward of imaging surface 138. Along with being positioned forward of imaging surface 138, e.g., along the transverse direction T, second air outlet 214 may be positioned above imaging surface 138, e.g., along the vertical direction V. As illustrated, second air outlet 214 defines a cooling airflow path 250 along imaging surface 138. Cooling airflow path 250 may extend from a position above the imaging surface 138 and may extend along at least a portion of the vertical length of the imaging surface 138. In some embodiments, the cooling airflow path 250 extends substantially all of the vertical length of the imaging surface 138. Thus, at least a portion of the airflow motivated by air handler 216 (FIG. 5) or air handler 216B (FIG. 6) may be directed from intake passage 222 to the ambient environment as it flows along imaging surface 138. Optionally, cooling airflow path 250 may be defined parallel to imaging surface 138, or otherwise at a nonparallel angle relative to the airflow angle of the airflow curtain path 242. Advantageously, the cooling airflow path 250 may draw heat from image monitor 112 to further prevent gas, fumes, or moisture from accumulating on imaging surface 138.

As further shown in FIGS. 5 and 6, in certain embodiments, an exhaust passage 258 is defined within casing 116. As shown, exhaust passage 258 may extend in fluid isolation from air intake passage 222 and air outlet passages 224, 226. That is, exhaust passage 258 may not be fluidly connected or in communication with air intake passage 222 and air outlet passages 224, 226. One or more interior exhaust duct walls 260 separate the air passages 222, 224, 226 and exhaust passage 258. An exhaust inlet 262 and an exhaust outlet 264 are defined at opposing ends of exhaust passage 258. In some embodiments, exhaust inlet 262 is defined by casing 116 proximate the bottom end 120. In addition, exhaust outlet 264 is defined through casing 116 proximate top end 118 (e.g., through a top wall of casing 116). Optionally, exhaust outlet 264 may include a plurality of exhaust apertures. In some such embodiments, exhaust outlet 264 may be positioned between the first aperture set 218 and the second temperature set 220, e.g., along the lateral direction L as best shown in FIG. 4. Each aperture of the first aperture set 218 and each aperture of the second aperture set 220 may be laterally spaced from exhaust outlet 264 (e.g., to restrict the flow of exhaust to the air inlet 210).

An exhaust air handler 266 may be mounted within exhaust passage 258 as shown in the depicted embodiments of FIGS. 5 and 6. As will be understood, exhaust air handler 266 may be provided as any suitable blower or fan (e.g., radial fan, tangential fan, etc.) positioned within casing 116 to actively move or motivate air, steam, or exhaust fumes through exhaust passage 258. During use of cooktop appliance 300 (FIG. 2), the heat, steam, or exhaust fumes 246 may be motivated by exhaust air handler 266 from open region 130 (FIG. 2) to exhaust passage 258 through exhaust inlet 262 and ultimately to exhaust outlet 264 (e.g., as indicated by arrows 268). Optionally, one or more filters (not pictured) may be provided at exhaust inlet 262 (e.g., between open region 130 and exhaust passage 258) to clean the air, steam, or exhaust fumes 246 as it enters casing 116. For instance, a grease filter having a suitable coarse filter medium, such as a metallic mesh including aluminum or stainless steel, may be mounted across exhaust inlet 262. Additionally or alternatively, an odor filter having a suitable fine filter medium, such as a mesh or block including activated carbon, may be mounted across exhaust inlet 262. Optionally, the odor filter may be positioned above or downstream from the grease filter.

As illustrated, at least a portion of exhaust passage 258 may be tapered downstream from exhaust air handler 266. For instance, an angled top plate 270 may be positioned proximate to top end 118 within exhaust passage 258. Angled top plate 270 may extend, for instance downward, from exhaust outlet 264, thereby reducing the cross-sectional area of exhaust passage 258 and accelerating the flow rate of air or exhaust gases (e.g., at 268) upstream of exhaust outlet 264. As air or exhaust gases flow from exhaust outlet 264, the accelerated flow rate induced by angled top plate 270 may advantageously prevent exhaust gases from flowing to air inlet 210.

In accordance with exemplary aspects of the present disclosure, as shown in FIG. 2, interactive assembly 110 includes a humidity sensor 160. Generally, humidity sensor 160 is configured to detect operation of cooktop appliance 300. More particularly, humidity sensor 160 is configured to detect or sense a humidity level of the air proximate humidity sensor 160. Signals indicative of the humidity level of the air proximate humidity sensor 160 are routed from humidity sensor 160 to controller 150. When operation is detected, output signals generated by humidity sensor 160 are used by controller 150 to automatically activate air handler 216 without external input from a user. Upon activation, air handler 216 moves or motivates air across or about image monitor 112. Accordingly, grease and moisture rising upward along the vertical direction V (denoted by arrows 246 in FIGS. 5 and 6), e.g., from a boiling pot of water heated by a heating element 326 of cooktop appliance 300, are prevented from forming on image monitor 112. Further, the air moved across or about image monitor 112 may cool components of image monitor 112.

Humidity sensor 160 may be any suitable type of humidity sensor configured to detect or sense a humidity level of the surrounding air or air proximate humidity sensor 160. For example, humidity sensor 160 may be a capacitive, bulk resistive, conductive film, or some other suitable type of sensor. Humidity sensor 160 is mounted to or within casing 116. As shown in FIG. 2, humidity sensor 160 is mounted within casing 116. Humidity sensor 160 may be directly mounted to casing 116 or indirectly mounted to casing 116. As one example, humidity sensor 160 may be mounted to image monitor 112, which is in turn mounted to or supported by casing 116. As another example, humidity sensor 160 is mounted to a bracket that is in turn mounted to casing 116. Notably, humidity sensor 160 is mounted above the cooktop appliance 300, e.g., along the vertical direction V. In some exemplary embodiments, the humidity sensor 160 is strategically mounted proximate a bottom end 136 of imaging surface 138 of image monitor 112, e.g., as shown in FIG. 2. In this way, signals routed from humidity sensor 160 to controller 150 are indicative of the humidity level of the air proximate imaging surface 138, and accordingly, air handler 216 may be activated to move air across the imaging surface 138 to prevent condensation from forming thereon and to cool the components of image monitor 112.

Further, in some embodiments, humidity sensor 160 is mounted to or within casing 116 such that humidity sensor 160 is aligned with one of the heating elements 326 along the lateral direction L and the transverse direction T. As noted previously, humidity sensor 160 is spaced from cooktop appliance 300 along the vertical direction V, e.g., by open region 130. By mounting humidity sensor 160 in such an alignment arrangement, humidity sensor 160 is strategically positioned to sense moisture in the air directly above one of the heating elements 326. As shown in FIG. 2, in some further embodiments, one or more heating elements 326 of the cooktop appliance 300 include at least one front forward heating element 320 and at least one rear heating element 322 positioned rearward of forward heating element 320 along the transverse direction T. In such embodiments, humidity sensor 160 is mounted to or within the casing 116 such that humidity sensor 160 is aligned with forward heating element 320 along the lateral direction L and the transverse direction T. By mounting humidity sensor 160 in such an alignment arrangement, humidity sensor 160 is strategically positioned to sense moisture in the air directly above one of the heating elements 326 that are generally the most commonly utilized.

As shown best in FIG. 1, in some exemplary embodiments, cooktop appliance 300 includes a first heating element 321 at the right side portion of cooktop surface 324 and a second heating element 323 at a left side portion of cooktop surface 324 of cooktop appliance 300. First heating element 321 is spaced from second heating element 323, e.g., along the lateral direction L. In such embodiments, humidity sensor 160 is a first humidity sensor that is mounted to or within casing 116 such that the first humidity sensor 160 is aligned with the first heating element 321 along the lateral direction L and the transverse direction T. That is, first humidity sensor 160 is positioned directly above first heating element 321 along the vertical direction V. Further, as shown, cooking system 100 further includes a second humidity sensor 170 mounted to or within casing 116 such that the second humidity sensor 170 is aligned with the second heating element 323 along the lateral direction L and the transverse direction T. That is, second humidity sensor 170 is positioned directly above second heating element 323 along the vertical direction V. Accordingly, in such embodiments, the dual humidity sensors 160, 170 may more readily and quickly sense increased moisture levels within the air above cooktop appliance 100, which may ultimately better prevent or minimize condensation from forming on image monitor 112. Such a sensor arrangement may be particularly advantageous for cooktop appliances with a wide lateral length or for cooktop appliances where the heating elements are spaced relatively far apart, e.g., four feet (4 ft.) apart. In some further embodiments, a humidity sensor may be mounted to or within casing 116 directly above each of heating elements 326 of cooktop appliance 300.

An exemplary manner in which humidity sensor 160, controller 150, and air handler 216 interact to ultimately flow air across or around image monitor 112 will be described below. As noted above, controller 150 is communicatively coupled with air handler 216 and humidity sensor 160. In some embodiments, controller 150 is configured to receive, from humidity sensor 160, one or more signals indicative of a humidity level of the air proximate the humidity sensor 160. Humidity sensor 160 may continuously sense the humidity level of the surrounding air and may continuously generate signals. In some embodiments, humidity sensor 160 may sense and generate signals at predetermined intervals, e.g., every five (5) seconds. Such signals may be routed to controller 150 by a suitable communication line, e.g., by a suitable wired or wireless connection. In some embodiments, the one or more signals generated by humidity sensor 160 are received by controller 150 directly from humidity sensor 160. In other embodiments, the one or more signals generated by humidity sensor 160 are received by controller 150 indirectly from humidity sensor 160. For instance, the signals may pass through or be routed through one or more electronic components, e.g., such as a signal filter or processor. Further, the signals generated by humidity sensor 160 may be any suitable type of signal, e.g., analog or digital. As one example, the output signals generated by humidity sensor 160 are output as a voltage output of humidity sensor 160. Humidity sensor 160 routes one or more signals to controller 150 regardless of whether cooktop appliance 300 is on or off.

Upon receiving the one or more signals from humidity sensor 160, controller 150 is configured to determine whether the humidity level has exceeded a predetermined activation threshold based at least in part on the one or more signals received from humidity sensor 160. In some embodiments, when controller 150 determines whether the humidity level has exceeded the predetermined activation threshold based at least in part on the one or more signals received from humidity sensor 160, controller 150 is configured to ascertain whether the humidity level has increased by a predetermined amount over a predetermined time period. An example is provided below.

Figure 7:
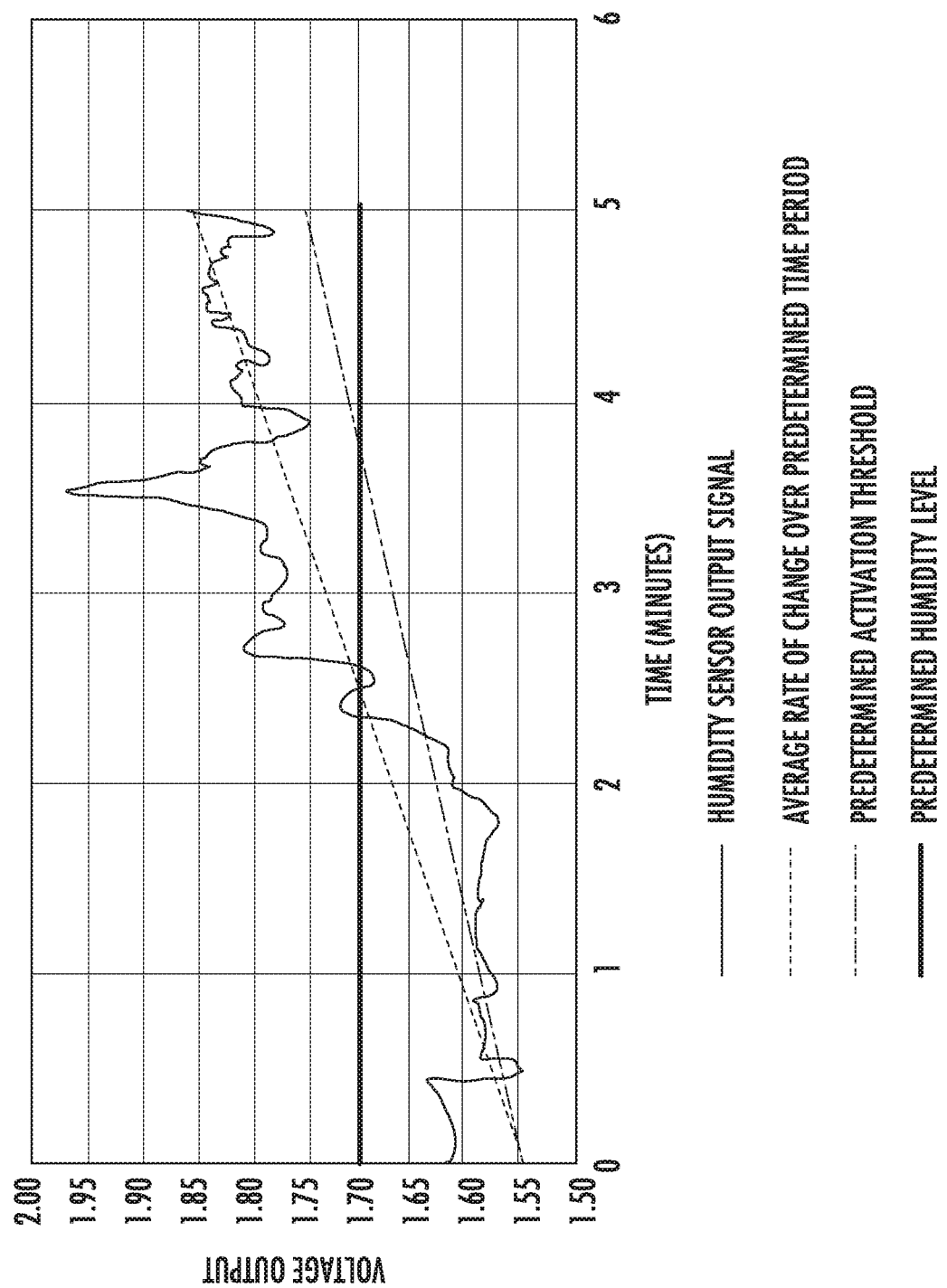
FIG. 7 provides an exemplary graph depicting an output signal of a humidity sensor as a function of time according to exemplary embodiments of the present disclosure.

FIG. 7 provides an exemplary graph depicting an output signal of a humidity sensor as a function of time. More particularly, the example graph depicts an output of the humidity sensor over time as a pot of water is boiled on one of the heating elements 326 of cooktop appliance 300. As shown, the voltage output of the humidity sensor has a generally positive slope over time. To determine whether the humidity level has exceeded the predetermined activation threshold based at least in part on the one or more signals received from humidity sensor 160, as noted above, controller 150 ascertains whether the humidity level has increased by a predetermined amount over a predetermined time period. That is, controller 150 determines whether the average rate of change of the humidity level, as represented by the voltage output over time, has a greater slope than the predetermined activation threshold for a predetermined time period or interval. With reference to FIG. 7, three (3) lines are depicted as a function of time, including the voltage output indicative of the humidity level of the air proximate humidity sensor 160, the average rate of change of the output signal for the predetermined time period, and the predetermined activation threshold. For this example, the predetermined time period is five (5) minutes. In some embodiments, the predetermined time period is at least two (2) minutes. In this way, the humidity sensor 160 is not inadvertently tripped.

As shown in FIG. 7, the average rate of change of the output signal for the predetermined time period has a greater slope than the predetermined activation threshold. Thus, water evaporated during the boiling operation increased the moisture in the surrounding air proximate humidity sensor 160 to a sufficient degree such that the humidity level exceeded the predetermined activation threshold. Accordingly, controller 150 recognizes that cooktop appliance 300 is performing operations, and in response, actively and automatically takes action to protect image monitor 112.

In yet other embodiments, to determine whether the humidity level has exceeded the predetermined activation threshold based at least in part on the one or more signals received from humidity sensor 160, controller 150 ascertains whether the humidity level is greater than a predetermined humidity level. In some embodiments, the sensed humidity level must be greater than the predetermined humidity level for a predetermined time, e.g., ten (10) seconds, to prevent inadvertent tripping of humidity sensor 160. For instance, with reference to FIG. 7, the predetermined humidity level corresponds with 1.70 volts. In the example of FIG. 7, the humidity level exceeds the predetermined humidity level at about the two and a half minute mark. As the humidity level has exceeded the predetermined humidity level, the humidity level has exceeded the predetermined activation threshold. Accordingly, controller 150 recognizes that cooktop appliance 300 is performing heating or cooking operations.

Once operation of cooktop appliance 300 is detected, controller 150 is configured to activate air handler 216 based at least in part on whether the humidity level has exceeded the predetermined activation threshold so that air is moved across or about the image monitor 112. For instance, if the humidity level exceeds the predetermined activation threshold, controller 150 activates air handler 216 to move or motivate an airflow to move across or about the image monitor 112. If, on the other hand, the humidity level does not exceed the predetermined activation threshold, controller 150 recognizes that cooktop operation 300 is not in operation or has not been operated to a degree to increase the humidity level to a sufficient degree.

In some embodiments, as noted previously and best shown in FIGS. 5 and 6, casing 116 defines air inlet 210 and air outlet 212. Air outlet 212 is positioned below image monitor 112 along the vertical direction V. In such embodiments, when air handler 216 is activated by controller 150, air handler 216 moves air through air outlet 214 and along airflow curtain path 242 defined substantially orthogonal to the vertical direction V (e.g., within twenty-five degrees (25°) of a direction orthogonal to the vertical direction V). By moving air along airflow curtain path 242, heat, steam, and/or exhaust fumes (represented by arrows 246 in FIGS. 5 and 6) generated at cooktop appliance 300 may be advantageously blocked or restricted by the mass of air flowing along airflow curtain path 242. In turn, the visibility at imaging surface 138 may be preserved, while further protecting various electronic components (e.g., imagine monitor 112 or controller 150 (FIG. 2)) mounted to or within casing 116.

In some embodiments, casing 116 defines air inlet 210 and air outlet 214. In such embodiments, air outlet 214 is positioned above image monitor 112 along the vertical direction V, e.g., as shown in FIGS. 5 and 6. Further, in such embodiments, when air handler 216 is activated, air handler 216 moves air through air outlet 214. In some further embodiments, as noted above, image monitor 112 includes imaging surface 138. When air handler 216 is activated by controller 150, air handler 216 moves air along cooling airflow path 250 defined along at least a portion of imaging surface 138 along the vertical direction V. Notably, as shown in FIGS. 5 and 6, a lateral front plate 254 of casing 116 includes a beveled surface 255 that at least partially defines air outlet 214 and is configured to direct or motivate air along cooling airflow path 250. By moving air along cooling airflow path 250, heat, steam, and/or exhaust fumes (represented by arrows 246 in FIGS. 5 and 6) generated at cooktop appliance 300 may be advantageously whisked away by the mass of air flowing along cooling airflow path 250 thus preventing condensation from forming on imaging surface 138. Moreover, the visibility at imaging surface 138 may be preserved, while further protecting various electronic components (e.g., imagine monitor 112 or controller 150 (FIG. 2)) mounted to or within casing 116.

Further, in some exemplary embodiments, casing 116 defines air inlet 210, second air outlet 214 defined above image monitor 112 along the vertical direction V, and first air outlet 212 defined below image monitor 112 along the vertical direction V. In such embodiments, when controller 150 activates air handler 216, air handler 216 moves or motivates air through second air outlet 214 along cooling airflow path 250 defined along at least a portion of imaging surface 138 along the vertical direction V and through first air outlet 212 and along airflow curtain path 242 defined substantially orthogonal to the vertical direction V (e.g., within twenty-five degrees (25°) of a direction orthogonal to the vertical direction V). In such embodiments, the advantages described above with respect motivating air along airflow curtain path 242 and cooling airflow path 250 are both applicable. Particularly, motivating air along the paths 242, 250 in combination provides extra protection for image monitor 112 and components of interactive assembly 110. In some embodiments, a single air handler 216 may be activated to move or motivate air through first air outlet 212 and second air outlet 214, e.g., as shown in FIG. 5. In other embodiments, multiple air handlers 216A, 218B, may be activated to move or motivate air through first air outlet 212 and second air outlet 214, respectively, e.g., as shown in FIG. 6.

Further, after controller 150 activates air handler 216 (or air handlers 216A, 216B), controller 150 is configured to receive one or more signals from humidity sensor 160 indicative of the humidity level of the air proximate humidity sensor 160. Humidity sensor 160 may continuously sense the humidity level of the surrounding air and may continuously generate signals after activation of air handler 216. In some embodiments, humidity sensor 160 may sense and generate signals at predetermined intervals, e.g., every five (5) seconds. Such signals may be routed to controller 150 in the same manner as noted previously. Upon receiving such signals, controller 150 determines whether the humidity level has exceeded a predetermined deactivation threshold based at least in part on the one or more signals from humidity sensor 160. To determine whether the humidity level has exceeded the predetermined deactivation threshold based at least in part on the one or more signals received from humidity sensor 160, controller 150 ascertains whether the humidity level is less than a predetermined deactivation humidity level. In some embodiments, the humidity level must be less than the predetermined deactivation humidity level for a predetermined time, e.g., five (5) seconds, to prevent inadvertent tripping of humidity sensor 160. If the humidity level exceeds the predetermined deactivation humidity level (e.g., by dropping below the predetermined deactivation humidity level), the humidity level has exceeded the predetermined deactivation threshold. Accordingly, controller 150 recognizes that cooktop appliance 300 is likely no longer performing heating or cooking operations and that image monitor 112 no longer needs air motivated or moved about or across it, e.g., to prevent condensation from forming thereon.

Consequently, controller 150 is configured to deactivate air handler 216 based at least in part on whether the humidity level has exceeded the predetermined deactivation threshold. If the humidity level exceeds the predetermined deactivation threshold, controller 150 deactivates air handler 216. If, however, the humidity level does not exceed the predetermined deactivation threshold, controller 150 does not deactivate air handler 216 and air handler 216 continues to move or motivate an airflow across and about image monitor 112.

Figure 8:
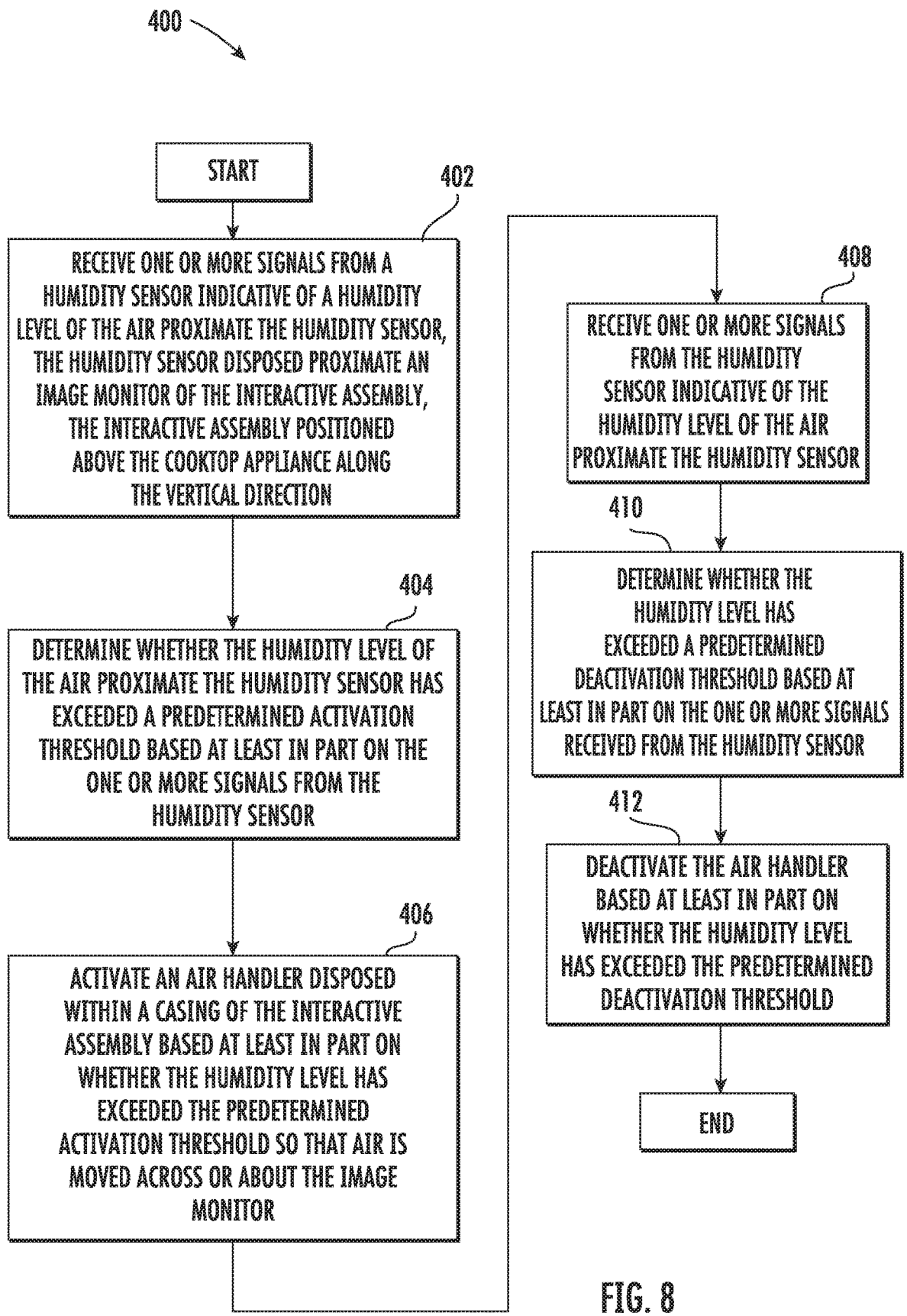
FIG. 8 provides a flow diagram of an exemplary method for operating a cooking system according to exemplary embodiments of the present disclosure.

FIG. 8 provides a flow diagram of an exemplary method (400) for operating a cooking system according to exemplary embodiments of the present disclosure. In some implementations, the cooking system includes an interactive assembly and a cooktop appliance defining a vertical direction. For instance, the cooking system may be the cooking system 100 depicted in FIGS. 1 through 6 and described in the accompanying text. Further, controller 150 of interactive assembly 110 of the system 100 may implement part or all of the method (400). To provide context to exemplary method (400), the reference numerals used in FIGS. 1 through 6 to describe the features of system 100 will be used below. It will be appreciated, however, that method (400) is not limited in scope to the system 100 of FIGS. 1 through 6; rather, method (400) is applicable to other suitable cooking systems.

At (402), method (400) includes receiving one or more signals from a humidity sensor indicative of the humidity level of air proximate the humidity sensor, the humidity sensor disposed proximate an image monitor of the interactive assembly, the interactive assembly positioned above the cooktop appliance along the vertical direction. For instance, the humidity sensor may be the humidity sensor 160 of the cooking system 100. Further, controller 150 is configured to receive such signals. The signals may be generated by humidity sensor 160 and are indicative of the humidity level of the air proximate humidity sensor 160. Humidity sensor 160 may continuously sense the humidity level of the surrounding air and may continuously generate signals. In some implementations, the humidity sensor may sense and generate signals at predetermined intervals, e.g., every ten (10) seconds. The one or more signals may be received from humidity sensor 160 by controller 150 directly or indirectly. In some implementations, the humidity sensor 160 is strategically mounted proximate a bottom end 136 of imaging surface 138 of the image monitor 112, e.g., as shown in FIG. 2. In this way, signals routed from humidity sensor 160 to controller 150 are indicative of the water vapor in the air proximate the imaging surface 138, and accordingly, air handler 216 may be activated to move air across or about the imaging surface 138 to prevent condensation from forming thereon.

At (404), method (400) includes determining whether the humidity level proximate the humidity sensor has exceeded a predetermined activation threshold based at least in part on the one or more signals from the humidity sensor. That is, once the signals are received by controller 150 of interactive assembly 110, controller 150 processes the signals and determines whether the humidity level proximate humidity sensor 160 has exceeded a predetermined activation threshold. For instance, controller 150 may determine whether the humidity level proximate humidity sensor 160 has exceeded the predetermined activation threshold in any of the ways described herein.

As one example, in some implementations, determining whether the humidity level has exceeded the predetermined activation threshold based at least in part on the one or more signals from the humidity sensor at (404) includes ascertaining whether the humidity level has increased by a predetermined amount over a predetermined time period. That is, controller 150 determines whether the average rate of change of the humidity level (e.g., as represented by the voltage output over time as shown in FIG. 7) has a greater slope than the predetermined activation threshold for a predetermined time period or interval. As another example, in some implementations, determining whether the humidity level has exceeded the predetermined activation threshold based at least in part on the one or more signals received from humidity sensor 160 includes ascertaining whether the humidity level is greater than a predetermined humidity level (e.g., as shown in FIG. 7). In some implementations, the humidity level must be greater than the predetermined humidity level for a predetermined time, e.g., five (5) seconds.

At (406), method (400) includes activating an air handler disposed within a casing of the interactive assembly based at least in part on whether the humidity level has exceeded the predetermined activation threshold so that air is moved across or about the image monitor. For instance, the air handler may be the air handler 216 of FIG. 5 or the air handlers 216A, 216B of FIG. 6.

In some implementations, when the air handler is activated at (406), the air handler moves air across an imaging surface of the image monitor. In some implementations, the imaging surface of the image monitor is a touchscreen. For example, with reference specifically to FIG. 5, air may be moved or motivated by air handler 216 to flow through second air outlet 214 and along the cooling airflow path 250 defined along at least a portion of imaging surface 138 of image monitor 112. In some implementations, lateral front plate 254 of casing 116 includes beveled surface 255 that at least partially defines air outlet 214. Beveled surface 255 is configured to direct or motivate air along cooling airflow path 250. By moving air along cooling airflow path 250, heat, steam, and/or exhaust fumes (represented by arrows 246 in FIGS. 5 and 6) generated at cooktop appliance 300 may be advantageously whisked away by the mass of air flowing along cooling airflow path 250 thus preventing condensation from forming on imaging surface 138. Moreover, the visibility at imaging surface 138 may be preserved, while further protecting various electronic components (e.g., imagine monitor 112 or controller 150 (FIG. 2)) mounted to or within casing 116.

In some further implementations, the casing defines an air inlet, a first air outlet defined above the image monitor along the vertical direction, and a second air outlet defined below the image monitor along the vertical direction. When the air handler is activated at (406), the air handler moves or motivates air through the first air outlet along a cooling airflow path defined along at least a portion of an imaging surface of the image monitor along the vertical direction and through the second air outlet and along an airflow curtain path defined substantially orthogonal to the vertical direction. For example, with reference to FIG. 5, air may be moved or motivated by air handler 216 from or through air inlet 210 and ultimately through second air outlet 214 and along the cooling airflow path 250 defined along at least a portion of imaging surface 138 of image monitor 112. Further, air may be moved or motivated by air handler 216 from or through air inlet 210 and ultimately through first air outlet 212 and along airflow curtain path 242 defined substantially orthogonal to the vertical direction V. In this way, image monitor 112 and components of interactive assembly 110 may be cooled and condensation may be prevented from forming thereon.

At (408), after activating the air handler at (406), the method (400) further includes receiving one or more signals from the humidity sensor indicative of the humidity level of air proximate the humidity sensor. Accordingly, even after air handler 216 is activated to move or motivate an airflow across or about image monitor 112, humidity sensor 160 continues to generate signals indicative of the humidity level of the air proximate humidity sensor 160 and controller 150 continues to receive them. In this way, as described below, controller 150 can cease operation of air handler 216 (i.e., deactivate air handler 216) when humidity levels have returned below a threshold.

At (410), method (400) includes determining whether the humidity level has exceeded a predetermined deactivation threshold based at least in part on the one or more signals received from the humidity sensor. For instance, controller 150 may determine whether the humidity level has exceeded a predetermined deactivation threshold by ascertaining whether the humidity level is less than a predetermined deactivation humidity level. In some embodiments, the humidity level must be less than the predetermined deactivation humidity level for a predetermined time, e.g., five (5) seconds. If the humidity level exceeds the predetermined deactivation humidity level (e.g., by dropping below the predetermined deactivation humidity level), the humidity level has exceeded the predetermined deactivation threshold. Accordingly, controller 150 recognizes that cooktop appliance 300 is likely no longer performing heating or cooking operations and that image monitor 112 no longer needs air motivated or moved about or across it, e.g., to prevent condensation from forming thereon.

At (412), accordingly, method (400) includes deactivating the air handler based at least in part on whether the humidity level has exceeded the predetermined deactivation threshold. For instance, controller 150 may route one or more communication signals representative of instructions for ceasing operation to an electric motor configured to drive air handler 216. Upon receiving the communication signals, electric motor may cease operation, which in turn deactivates air handler 216.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system defining a vertical direction, a lateral direction, and a
   transverse direction, the system comprising:
   an interactive assembly, comprising:
   an image monitor;
   a casing supporting the image monitor, the casing defining an air inlet, a first air outlet defined above the image monitor along the vertical direction, and a second air outlet defined below the image monitor along the vertical direction;
   an air handler mounted within the casing;
   a humidity sensor mounted to or within the casing; and
   a controller communicatively coupled with the air handler and the humidity sensor, the controller configured to:
   receive, from the humidity sensor, one or more signals indicative of a humidity level of air proximate the humidity sensor;
   determine whether the humidity level has exceeded a predetermined activation threshold based at least in part on the one or more signals received from the humidity sensor; and
   activate the air handler based at least in part on whether the humidity level has exceeded the predetermined activation threshold so that the air handler moves air through the first air outlet along a cooling airflow path defined along at least a portion of an imaging surface of the image monitor along the vertical direction and through the second air outlet and along an airflow curtain path defined orthogonal to the vertical direction.

2. The system of claim 1, wherein the first air outlet is at least partially defined by a beveled surface configured to direct air downward along the vertical direction such that air moves along the cooling airflow path when the air handler is activated.

3. The system of claim 1, wherein when the controller determines whether the humidity level has exceeded the predetermined activation threshold based at least in part on the one or more signals received from the humidity sensor, the controller is configured to:
   ascertain whether the humidity level has increased by a predetermined amount over a predetermined time period.

4. The system of claim 1, wherein the humidity sensor is mounted proximate a bottom end of an imaging surface of the image monitor.

5. A method for operating a system defining a vertical direction comprising an interactive assembly, the method comprising: receiving one or more signals from a humidity sensor indicative of a humidity level of air proximate the humidity sensor, the humidity sensor disposed proximate an image monitor of an interactive assembly; determining whether the humidity level of air proximate the humidity sensor has exceeded a predetermined activation threshold based at least in part on the one or more signals from the humidity sensor; and
   activating an air handler disposed within a casing of the interactive assembly based at least in part on whether the humidity level has exceeded the predetermined activation threshold, the casing defines an air inlet, a first air outlet defined above the image monitor along the vertical direction, and a second air outlet defined below the image monitor along the vertical direction, wherein in activating the air handler disposed within the casing of the interactive assembly based at least in part on whether the humidity level has exceeded the predetermined activation threshold, the air handler moves air through the first air outlet along a cooling airflow path defined along at least a portion of an imaging surface of the image monitor along the vertical direction and through the second air outlet and along an airflow curtain path defined substantially orthogonal to the vertical direction.

6. The method of claim 5, wherein the imaging surface of the image monitor is a touchscreen.

7. The method of claim 5, wherein the humidity sensor is mounted proximate a bottom end of the imaging surface of the image monitor.

8. The method of claim 5, wherein determining whether the humidity level has exceeded the predetermined activation threshold based at least in part on the one or more signals from the humidity sensor comprises ascertaining whether the humidity level has increased by a predetermined amount over a predetermined time period.

9. The method of claim 8, wherein determining whether the humidity level has exceeded the predetermined activation threshold based at least in part on the one or more signals from the humidity sensor comprises ascertaining whether the humidity level is greater than a predetermined humidity level.

10. The method of claim 5, wherein after activating the air handler, the method further comprises:
    receiving one or more second signals from the humidity sensor indicative of a second humidity level of air proximate the humidity sensor;
    determining whether the second humidity level has exceeded a predetermined deactivation threshold based at least in part on the one or more second signals received from the humidity sensor; and
    deactivating the air handler based at least in part on whether the second humidity level has exceeded the predetermined deactivation threshold.

\* \* \* \* \*